DIRECT COUPLED AMPLIFIER WITH STABILIZED OPERATING POINT

Filed Feb. 25, 1963

INVENTORS
ALEXANDER D. MC LEOD
ROBERT H. VAN LIGTEN
BY
Ezekiel Wolf, Wolf & Greenfield
ATTORNEYS United States Patent Office 3,241,082

Patented Mar. 15, 1966

3,241,082

DIRECT COUPLED AMPLIFIER WITH STABILIZED OPERATING POINT

Robert H. Van Ligten, Reading, and Alexander D. McLeod, North Reading, Mass., assignors to Transitron Electronic Corporation, Wakefield, Mass., a corporation of Delaware Filed Feb. 25, 1963, Ser. No. 260,639

7 Claims. (Cl. 330—19)

The present invention relates in general to amplifiers and more particularly concerns a novel direct-coupled amplifier with a stabilized operating point. An exemplary embodiment of the invention is especially useful where high gain is desired with an exceptionally small amplifier capable of being energized efficiently from a low voltage self-contained cell, such as a hearing aid amplifier.

The introduction of transistors has been of considerable value in the development of miniature hearing aid amplifiers operable for relatively long periods with a small self-contained cell. However, the design of these amplifiers presents serious problems when designing an amplifier with direct-coupled stages throughout so as to maximally utilize the energy available from the cell for amplification. An especially serious problem relates to maintaining stable operating points throughout the amplifier. It is well known that transistors change characteristics in the presence of temperature changes. Thus, the static D.-C. current drawn by the transistors may vary directly with temperature in the absence of corrective measures. And operating points may change as the cell voltage decreases. These operating point changes introduce changes in gain and increase the likelihood of developing distortion. A typical approach to correcting the problem involves the use of passive elements in a negative feedback circuit. While this arrangement provides some reduction in the problem, the stabilization obtained is less than that which would be desired.

It is an important object of this invention to provide a direct-coupled amplifier with exceptionally stable operating points relatively insensitive to circuit parameter changes resulting from environmental changes or other conditions.

It is a further object of this invention to achieve the preceding object with the fully-transistorized amplifier circuit that is small and efficiently utilizes the available energy from a small cell for providing exceptionally high gain with great stability and relatively low distortion.

According to the invention, the electrical amplification apparatus comprises an input, an output, and a direct-coupled amplifier coupling the input to the output. Means are provided to differentially combine a reference D.-C. signal with the signal at the output to provide a feedback signal having a D.-C. signal component related to the difference between that at the direct-coupled amplifier output and the reference D.-C. signal. A low pass filter couples the latter feedback signal to the direct-coupled amplifier input.

Figure 1:
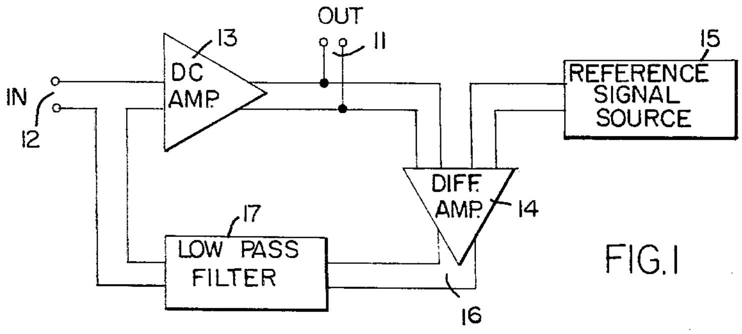
Figure 2:
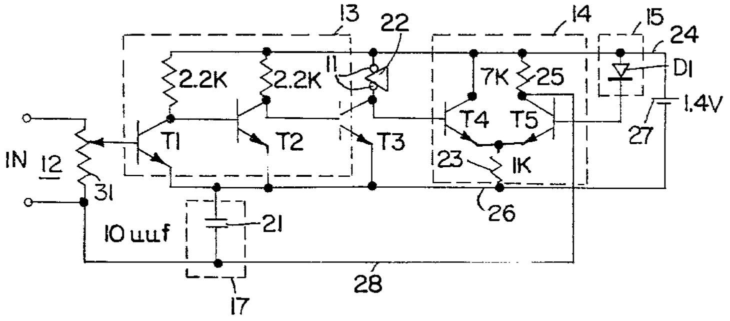

Numerous other features, objects and advantages of the invention will become apparent from the following specification when read in connection with the accompanying drawing in which:

FIG. 1 is a block diagram generally illustrating the logical arrangement of an amplifying system according to the invention; and FIG. 2 is a schematic circuit diagram of a preferred embodiment of the invention.

With reference now to the drawing and more particularly FIG. 1 thereof, there is shown a block diagram generally illustrating the logical arrangement of a system according to the invention which provides an amplified signal on output terminal pair 11 in response to input signal applied to input terminal pair 12. A D.-C. amplifier 13 intercouples input 12 and output 11.

A differential amplifier 14 differentially combines the signal on output 11 with the D.-C. reference signal provided by reference signal source 15 to provide a feedback signal at the differential amplifier output 16 having a D.-C. component representative of the difference between the reference signal and the D.-C. component of the signal on output terminal pair 11. This feedback signal is coupled by filter 17 to input 12.

Referring to FIG. 2, there is shown a schematic circuit diagram of a preferred embodiment of the invention incorporating NPN transistors T1–T3 and associated circuit components as D.-C. amplifier 13 and transistors T4 and T5 and associated circuit components as differential amplifier 14. Forward-biased diode D1 comprises reference signal source 15. Capacitor 21 coacts with the output impedance of differential amplifier 14 to comprise filter 17.

Transistors T1–T3 comprise three direct-coupled stages providing relatively high gain with a minimum of circuit components. With the input impedance of each transistor low compared to the output impedance of a previous stage, the total current gain of the cascaded amplification stages is substantially the product of the gains of the individual stages.

A speaker 22 is shown connected between output terminals for reproducing audio input signals applied to the input terminals 12.

Differential amplifier 14 comprises transistors T4 and T5 having a common emitter resistor 23. The collector of transistor T4 is connected to the positive line 24. A collector load resistor 25 is connected between the positive line 24 and the collector of transistor T5.

The collector of transistor T3 is direct-coupled to the base of transistor T4. Foward-biased diode D1 is connected between positive lead 24 and the base of transistor T5.

The collectors of all the transistors are direct-coupled to the positive line 24 through respective load impedances except for transistor T4, the collector there being directly connected to line 24 as mentioned above. All the emitters of the transistors are directly connected to the negative line 26 except that the emitters of transistors T4 and T5 are coupled to this line through the common emitter resistor 23. Battery 27 is connected as shown between positive line 24 and negative line 26.

The collector of transistor T5 comprises the feedback output for delivering the feedback signal to feedback line 28. Capacitor 21 is connected between feedback line 28 and negative line 26.

A gain control potentiometer 31 is connected between input terminals 12. One end of this potentiometer is connected to feedback line 28. The arm of potentiometer 31 is connected to the base of the input transistor T1.

Having described the circuit arrangement it is appropriate to consider the mode of operation. The input signal applied between terminals 12 is amplified and reproduced by loudspeaker 22. Capacitor 21 presents effectively a short circuit between feedback line 28 and the emitter of transistor T1 so that a fraction of the A.-C. input signal, depending on the setting of potentiometer 31, is impressed between base and emitter of transistor T1 for amplification.

Now consider a situation in which the base current drawn by transistor T1 increases by a small increment. This change causes a corresponding incremental decrease in the potential on the collector of transistor T1, decreasing the base-emitter potential of transistor T2 to cause that transistor to draw less base current and cause its collector to rise. The rise in collector potential of transistor T2 is transmitted to the base of transistor T3, causing that transistor to draw more base current and its collector potential to decrease. This decrease is transmitted to the base of transistor T4, causing it to draw less base current with a resultant potential decrease on the emitter of transistor T5. This drop in emitter potential and the fact that the base potential of transistor T5 is held approximately constant by D1 causes transistor T5 to draw more base current with a corresponding drop in its collector potential. This drop in collector potential is transmitted through potentiometer 31 to transistor T1 to draw less base current, thereby compensating for the slight initial increase in base current with a resultant change of substantially zero. That is how D.-C. stabilization is effected. Yet there is virtually no degenerative feedback at signal frequencies because capacitor 21 is effectively a short circuit. Thus, a high degree of D.-C. feedback is effected to provide D.-C. stabilization while providing negligible A.-C. feedback so that the D.-C. stabilized amplifier provides exceptionally high A.-C. gain.

In a representative embodiment of the invention transistors T1–T5 are type 2N708 NPN transistors, diode D1 is a type 1N914 stabistor diode and potentiometer 31 is 10K ohms, the remaining parameter values being indicated on the circuit diagram. Speaker 11 is a 500 ohm miniature loudspeaker. This representative embodiment provides a gain between input 12 and output 11 of >70 db while the operating point remains stable with 1 ma. ±.2 ma. over a temperature range from plus 60° C. to minus 20° C. and over a change in cell voltage from 1.4 volt to 1.1 volt.

It is evident that those skilled in the art may now make numerous modifications of and departures from the specific embodiment described herein without departing from the inventive concepts. Consequently, the invention is to be considered as limited only by the spirit and scope of the appended claims.

What is claimed is:

1. Electrical amplification apparatus for amplifying A.-C. signals comprising,
- an input for receiving A.-C. signals to be amplified,
- an output,
- a direct-coupled amplifier having D.-C. operating points coupling said input to said output,
- a source of a fixed potential reference D.-C. signal,
- means for differentially combining said reference D.-C. signal with the signal at said output to provide a feedbacks signal at its output having a D.-C. signal component related to the difference between that at said output and said reference D.-C. signal and representative of the deviation of said D.-C. operating points from prescribed normals,
- a low pass filter for rejecting said A.-C. signals and for transmitting said D.-C. signal component coupling the latter output to said input to reduce said deviation,
- said direct-coupled amplifier comprising a plurality of transistors intercoupling said input and output,
- said differential combining means comprising first and second transistors each having at least base, emitter and collector electrodes,
- said reference signal source comprising a unilaterally conducting device,
- a resistor common to the emitters of said first and second transistors,
- means for direct coupling said D.-C. amplifier output to said first transistor base,

- means for direct coupling said unilaterally conducting device to said second transistor base,
- a collector load resistor in series with said second transistor collector,
- and means including said low pass filter for direct coupling said second transistor collector to said input.

2. Electrical amplification apparatus in accordance with claim 1 wherein said reference D.-C. signal source further comprises a battery in series with said unilaterally conducting device,
- and further comprising means for direct-coupling said battery to all said transistors.

3. Electrical amplification apparatus comprising,
- a cell with first and second terminals,
- a plurality of cascaded direct-coupled transistor amplifier stages having a transistor with its collector direct-coupled to said first terminal and its emitter direct-coupled to said second terminal,
- first and second input terminals,
- means for direct-coupling said first input terminal to the base of the transistor in the first of said stages,
- means including a capacitor in series with said second input terminal and the emitter of said first stage transistor,
- a differential amplifier comprising first and second transsistors having their emitters direct-coupled to said cell second terminal through a common resistance and their collectors direct coupled to said cell first terminal,
- a unilaterally conducting device direct-coupling said cell first terminal to the base of said differential amplifier second transistor,
- and means for direct-coupling the collector of said second transistor to said first stage transistor base,
- said capacitor being in series with said second transistor collector and said first stage transistor emitter.

4. Electrical amplification apparatus in accordance with claim 3 and further comprising,
- a resistance connected between said first and second input terminals for direct-coupling said second transistor collector to said first stage transistor base.

5. Electrical amplification apparatus in accordance with claim 4 and further comprising,
- an adjustable arm connected between said resistance and said first transistor stage base for selectively controlling the gain of said apparatus.

6. Electrical amplification apparatus in accordance with claim 3 wherein the means for direct coupling the collector of the transistor in the last of said stages to said cell first terminal comprises a loudspeaker.

7. Electrical amplification apparatus in accordance with claim 5 wherein the means for direct coupling the collector of the transistor in the last of said stages to said cell first terminal comprises a loudspeaker.

References Cited by the Examiner

UNITED STATES PATENTS

| | | | |
|---|---|---|---|
| 2,714,136 | 7/1955 | Greenwood | 330—9 |
| 2,955,259 | 10/1960 | Lax | 330—25 XR |

OTHER REFERENCES

Barnette, W. E. and Giacoletto, L. J.: "Differential Amplifier for Null Detection," Electronics, August 1955, page 148 relied upon.

NATHAN KAUFMAN, *Primary Examiner.*

ROY LAKE, *Examiner.*